United States Patent [19]

Cricchi et al.

[11] 4,053,916
[45] Oct. 11, 1977

[54] SILICON ON SAPPHIRE MOS TRANSISTOR

[75] Inventors: James R. Cricchi, Catonsville; Michael D. Fitzpatrick, Glen Burnie, both of Md.

[73] Assignee: Westinghouse Electric Corporation, Pittsburgh, Pa.

[21] Appl. No.: 610,493

[22] Filed: Sept. 4, 1975

[51] Int. Cl.² .............. H01L 27/12; H01L 29/78; H01L 29/34
[52] U.S. Cl. ................................. 357/23; 357/4; 357/86; 357/52
[58] Field of Search ................... 357/4, 23, 52, 86

[56] References Cited
U.S. PATENT DOCUMENTS 3,484,662 12/1969 Hagon ........................ 357/4
3,590,342 6/1971 Jekat ........................... 357/23

Primary Examiner—Edward J. Wojciechowicz
Attorney, Agent, or Firm—J. B. Hinson

[57] ABSTRACT

An MOS transistor constructed using silicon on sapphire technology in which the channel region can be electrically connected either to the source or drain terminal is disclosed. The transistor is advantageous in that the shift of the threshold voltage of the transistor in the presence of radiation is substantially decreased. Connecting the channel region of the transistor to the source terminal also substantially reduces what is normally referred to as the "kink" effect in MOS transistors utilizing floating substrate channel regions. Reducing the sensitivity to radiation and the kink effect results in a transistor having improved electrical characteristics.

10 Claims, 7 Drawing Figures

SILICON ON SAPPHIRE MOS TRANSISTOR

STATEMENT OF GOVERNMENT INTEREST

This invention described herein was made in the course of, or under, Contract No. F33615-73-C-1093 with the United States Air Force.

BACKGROUND OF THE INVENTION

1. Field of the Invention

The invention relates to semiconductor devices and more particularly to silicon on sapphire MOS transistors providing means for independently biasing the channel substrate.

2. Description of the Prior Art

Typical prior art MOS transistors constructed using semiconductor substrates supported by an insulating layer (silicon on sapphire being one example of such a technology) resulted in transistors which had a relatively high sensitivity to radiation especially when these transistors were operated with zero steady state gate bias. The electrical characteristics of these transistors also included two "kinks" caused primarily by the floating channel substrate region. These undesirable characteristics of prior art MOS transistors caused difficult design problems.

SUMMARY OF THE INVENTION

Prior art MOS transistors constructed on an insulating substrate, for example silicon sapphire, had several undesirable characteristics. These undesirable characteristics included threshold voltage shifts in the presence of radiation and the well-known "kink" effect. The transistor which is the subject of this application provides a convenient way of coupling the channel region of the transistor to either the source or the drain. Coupling the channel to either the drain or the source substantially improves the characteristics of the transistor. The above discussed advantageous characteristics are provided by an interdigitated source structure which comprises alternating regions of semiconductor material with the areas forming the source being separated by narrow strips of semiconductor material of the opposite conductivity type. In the preferred embodiment, the regions of opposite conductivity type extend to the channel region and the metalization forming the source terminal electrically contacts both of the regions. This provides a simple structure in which the normally floating channel is connected directly to the source terminal.

In an alternate embodiment separate electrical contacts are provided for the channel region contact and the source region permitting the channel and source regions to be biased at different potentials if the application indicates such biasing is desirable.

DETAILED DESCRIPTION

Figure 1:
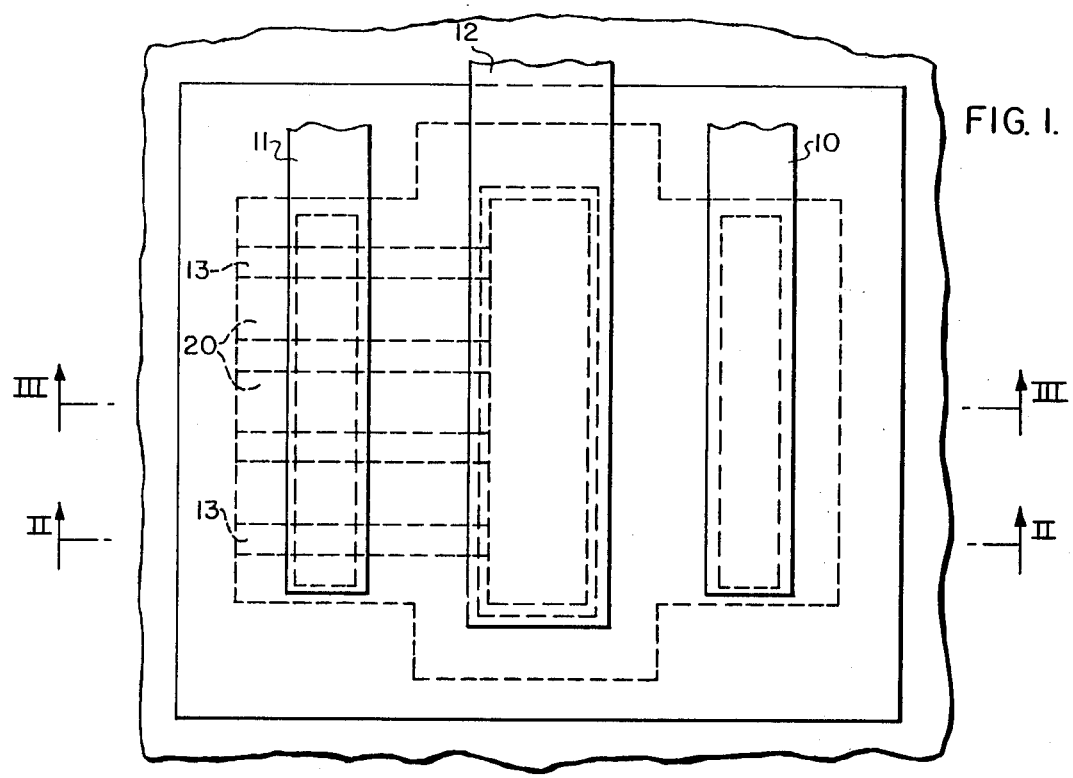
FIG. 1 is a top view of one embodiment of the invention.

A top view of the preferred embodiment of the invention is illustrated in FIG. 1. The MOS transistor which is the preferred embodiment of the invention includes a drain terminal 10, a source terminal 11 and a gate terminal 12. The source region of the transistor also includes a plurality of relatively narrow regions 13 of heavily doped semiconductor material. These regions extend from the channel region to the source terminal of the transistor.

Figure 2:
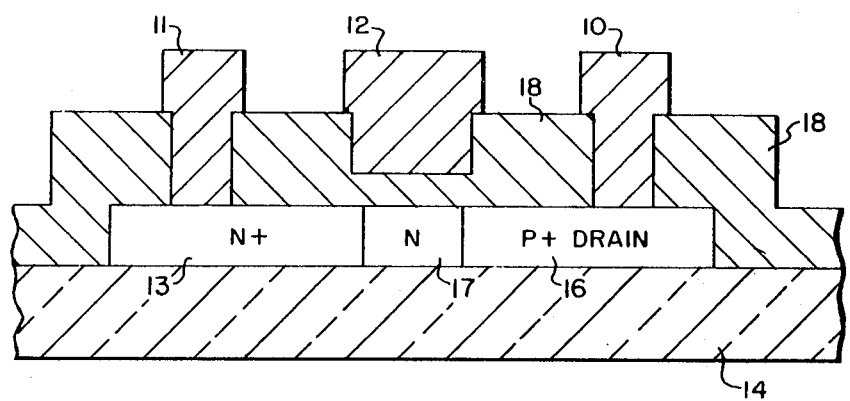
FIG. 2 is a cross section through FIG. 1 taken along the line II-II'.
Figure 3:
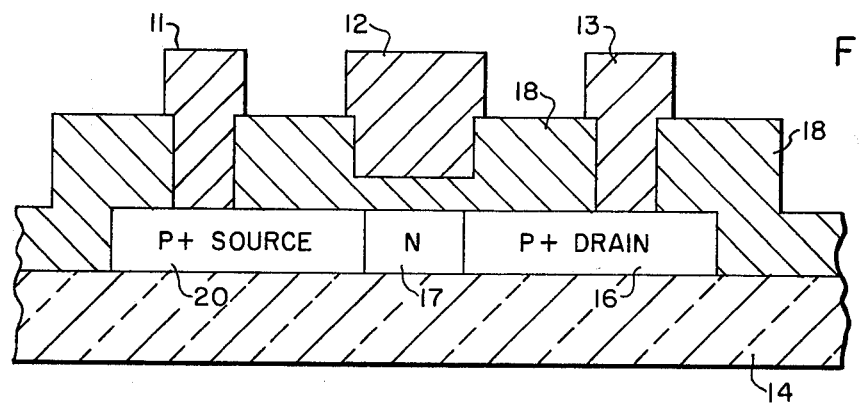
FIG. 3 is a second cross section of FIG. 1 taken along the line III-III'.

FIG. 2 is a cross section of the transistor illustrated in FIG. 1 taken along section line II-II'. In the preferred embodiment of the invention, illustrated in top view of FIG. 1, the transistor is constructed on a semiconductor island supported by an insulating substrate. In FIG. 2 the insulating substrate 14 may be sapphire, for example. The semiconductor portion of the structure, along section line II-II', includes a P+ drain region 16, and N-type channel region 17 and an N+ high conductivity region 13 which interconnects the channel region 17 with the source electrode 11. The top surface of the semiconductor structure is covered by an oxide layer 18 which separates the gate electrode 12 from the n channel region 17. Insulating layer 18 also has two openings which permit the drain electrode 10 to contact the P+ drain region 16 and the source electrode 11 to contact the high conductivity n+ region 13 and the P+ source region 20 (FIG. 3). Each of the high conductivity N+ regions 13 illustrated in FIG. 1 are identical to the one illustrated in cross section in FIG. 2.

FIG. 3 is a cross section of the transistor illustrated in FIG. 1 taken along line III-III'. This figure illustrates the P+ source regions 20 which are interdigitated with the high conductivity N+ regions 13. As previously illustrated, the transistor is supported by the insulating substrate 14 and includes a P+ source region 20 separated from the P+ drain region 16 by the N-type channel region 17. Gate terminal 12 is separated from the channel region 17 by insulating layer 18. The insulating layer 18 also includes two openings permitting the source electrode 11 to make contact with the P+ source region 20 and the drain electrode 13 to make contact with the P+ drain region 16. The source electrode 11 overlaps and makes electrical contact with a plurality of the high conductivity regions 13 and P+ source regions 20 connecting these regions together through a very low resistance electrical path. The high conductivity N+ regions 13 (FIG. 2) connect the channel region 17 to the source electrode 11 with the P+ source regions 20 acting as the normal source regions of a conventional MOS transistor.

Figure 4:
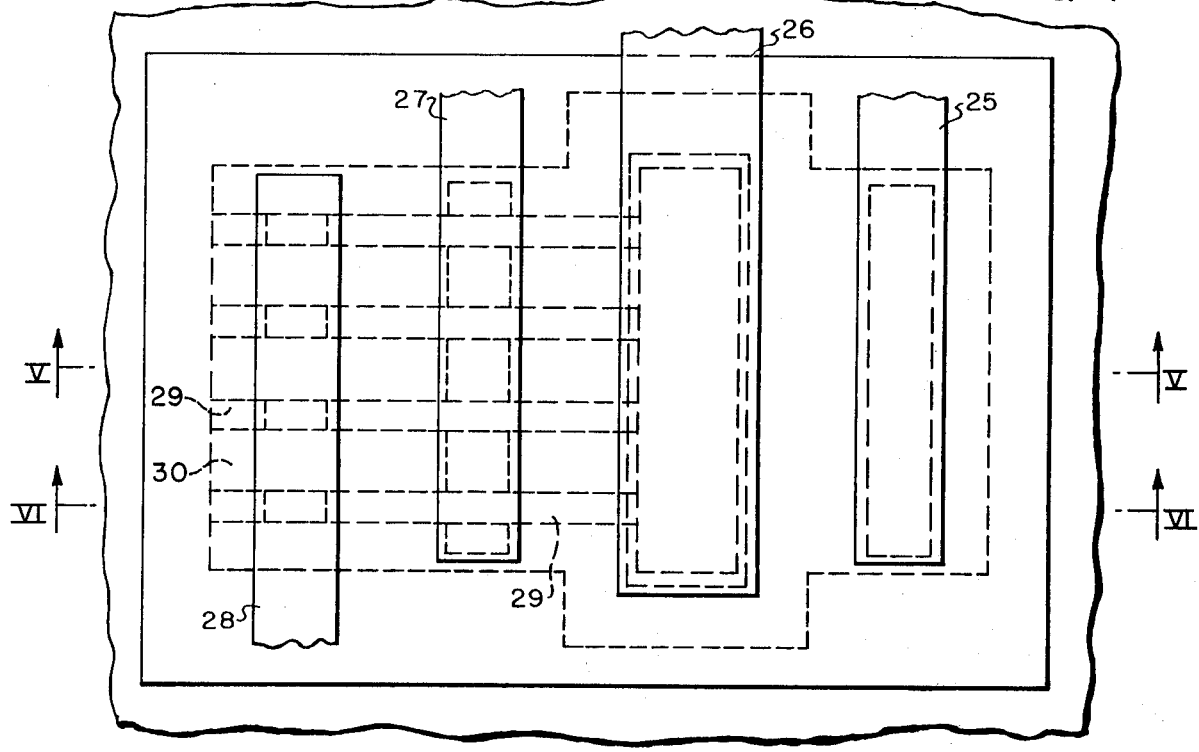
FIG. 4 is a top view of a second embodiment of the invention.

FIG. 4 is an alternate embodiment of the invention which provides a separate channel substrate electrode permitting the channel substrate to be biased to any desired potential independent of either the source or drain. The alternate embodiment illustrated in FIG. 4 includes a drain electrode 25, a gate electrode 26, a source electrode 27 and a channel substrate electroe 28.

Figure 5:
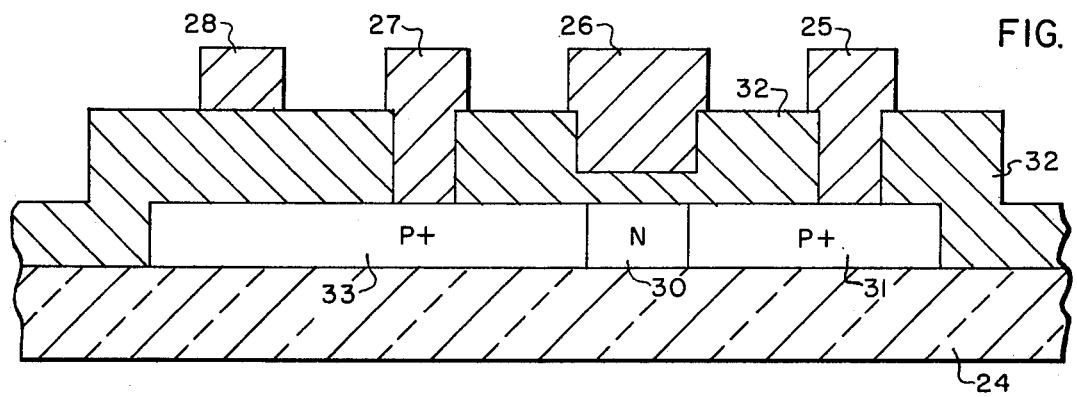
FIG. 5 is a cross section of FIG. 4 taken along line V-V'.

FIG. 5 is a cross section of the transistor illustrated in top view in FIG. 4 taken along section line V-V'. This view illustrates the P+ drain region 31 separated from the P+ source region 33 by the channel 30. Gate electrode 26 is separated from the channel region 30 by an insulating layer 32 such as silicon oxide. Drain electrode 25 contacts the drain region 31 through an opening in the insulating layer 32. Similarly source electrode 27 contacts the P+ source region 33 through an opening in the insulating layer 32. Substrate electrode 28 is insulted from the P+ source region 33 by the insulating layer 32.

Figure 6:
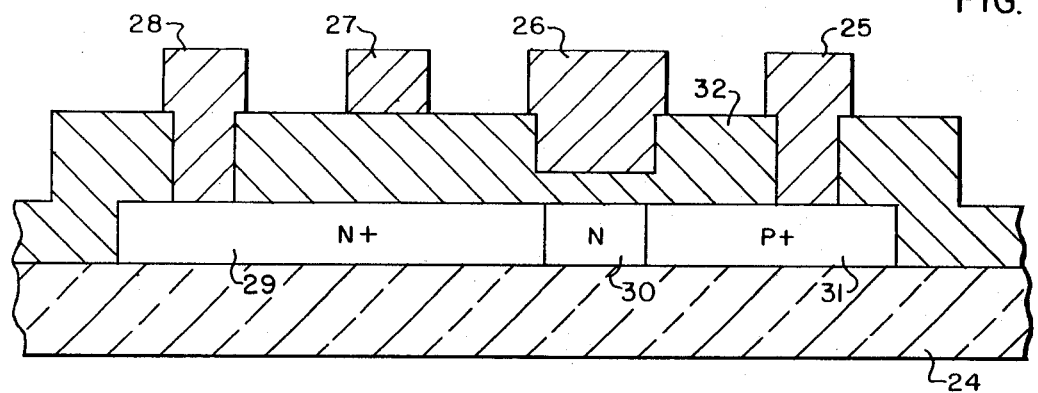
FIG. 6 is a cross section of FIG. 4 taken along the line VI-VI'.

FIG. 6 is a cross section of the transistor illustrated in top view in FIG. 4 and taken along line VI-VI'. The transistor illustrated in top view in FIG. 4 is constructed on an insualting substrate 24 which may be sapphire, for example. As previously discussed, the transistor includes a P+ drain region 31 separated from the source region by an n type channel 30. The gate electrode 26 is insulated from the channel region 30 by an insulating layer 32. The insulating layer 32 includes openings permitting the drain electrode 25 to make contact with the drain region 31. Channel substrate electrode 28 also makes contact with the n+ high conductivity regions 29 through an opening in the insulating layer 32. The high conductivity N+ region 29 extends from the substrate electrode 28 to the channel region 30 thereby providing an electrical connection to the channel substrate. As indicated in the top view in FIG. 4, there are a plurality of these regions with all the regions connected to the channel substrate electrode 28 through openings on the insulating layer 32. This provides a low resistance contact to the channel substrate.

Substrate electrode 28 may be used to bias the channel substrate at a potential different from the source, however, the biasing circuits should be arranged such that the P-n junction formed by the n+ regions 29 and the source regions 33 is reverse biased thereby electrically isolating these regions.

Figure 7:
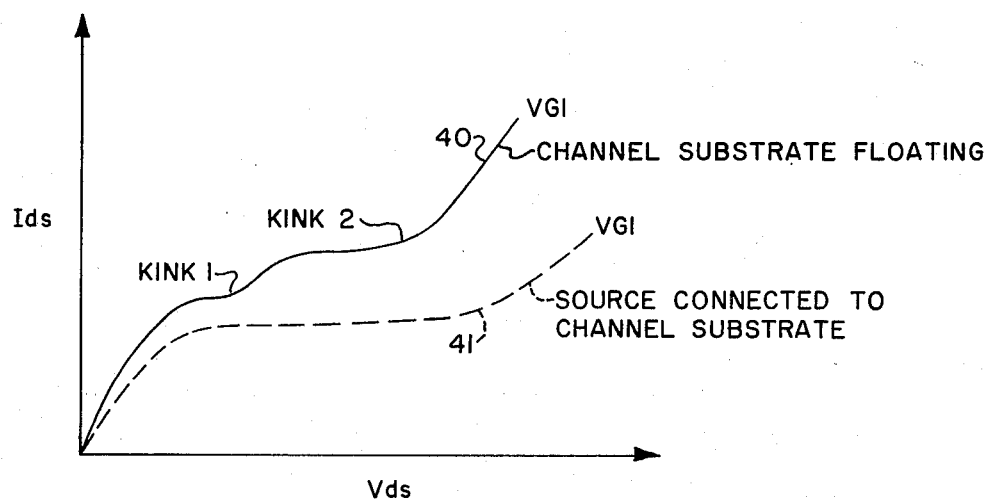
FIG. 7 is a curve illustrating the difference between the electrical characteristics of an MOS transistor having a floating channel and a MOS transistor having a channel region connected to the source.

FIG. 7 illustrates the electrical characteristic curves of a typical prior art silicon on sapphire MOS transistor along with the characteristic of a device of the type illustrated in FIGS. 1 and 4. This characteristic illustrates the drain current versus drain-to-source voltage for a constant gate voltage. The characteristic of a floating channel substrate device is illustrated at reference numeral 40 and includes two kinks labeled "kink 1" and "kink 2." This characteristic is well discussed in the literature of silicon on sapphire MOS transistos and therefore a detailed description of why these occur is believed to be unnecessary at this point. The characteristic of a device of the type illustrated in FIGS. 1 and 4 with the channel substrate region connected to the source is illustrated at reference numeral 41. From this characteristic it is clear that the kinks have been substantially removed by the improved structure. Additionally, providing a low resistance electrical connection between the channel region and the source substantially reduces the shift in the threshold voltage of the transistor when operated with zero gate bias and subjected to radiation. Thus the device illustrated in FIG. 1 offers a substantial improvement over prior art devices in that it is substantially free of the "kink" effect and the radiation resistance of the device has been improved.

The transistors described above can be constructed using well-known diffusion and etching processes. Therefore, the process steps for constructing the transistors described above will not be described in detail.

Although the device which is the subject of this invention has been described in detail with respect to an n channel device it will be obvious to those skilled in the art that it is equally applicable to P channel type devices.

We claim:
1. A planar transistor comprising
   a. a semiconductive structure including:
      1. a channel region of a first conductivity type interposed between drain and source regions of a second conductivity type,
      2. at least one high conductivity region of said first conductivity type contiguous to said source and channel regions;
   b. an insulating layer overlying said channel region;
   c. an electrically conductive layer overlying said insulating layer to form the gate of said transistor;
   d. electrically conductive means electrically coupled to said drain region to form the drain terminal of said transistor; and
   e. electrically conductive means coupled to said source region and to said high conductivity region to form the source terminal of said transistor
2. A planar MOS transistor having gate, source and drain terminals comprising:
   a. a semiconductive structure including:
      1. drain and source regions of a first conductivity type,
      2. a channel region of second conductivity type interposed between said drain and source regions,
      3. at least one electrically conductive region of said second conductivity type forming a low resistance path to said channel region;
   b. an electrically insulating layer overlying said channel region;
   c. first electrically conductive means overlying said insulting layer to form the gate terminal of said transistor;
   d. second electrically conductive means forming an electrically conductive path to said drain region to form said drain terminal;
   e. third electrically conductive means coupled through a low resistance path to said source region and to said at least one electrically conductive region of said second conductivity type to form the source of said transistor.
3. A planar MOS transistor having a gate, source and drain terminals, comprising in combination;
   a. a semiconductive structure supported on an electrically insulating substrate, said semiconductive structure comprising;
      1. drain and source regions of a first conductivity type,
      2. a channel region of a second conductivity type interposed between said drain and source region,
      3. at least one electrically conductivity region of said second conductivity type forming a low resistance path to said channel region;
   b. an electrically insulating layer overlying said channel region;
   c. first electrically conductive means overlying said insulating layer to form said gate terminal;
   d. second electrically conductive means coupled through a low resistance path to said drain region to form the drain terminal by said transistor; and
   e. third electrically conductive means coupled through a low resistance path to said source region and to said at least one electrically conductive region of said second conductivity type to form the source terminal of said transistor.
4. A planar MOS transistor comprising a drain and source with a channel interposed therebetween:
   a. a semiconductive structure comprising:

1. drain of a first conductivity type,
2. a region including alternating portions of said first conductivity type and a second conductivity type with said portions of said first conductivity type forming the source of said transistor with said portions of said second conductivity type forming a low resistance path to a channel region of said second conductivity type interposed between said drain and source regions;

b. an electrically insulating layer overlying said channel regon;

c. a first electrically conductive layer overlying said insulating layer to form a gate terminal of said transistor;

d. first electrically conductive means coupled through a low resistance path to said drain region to form the drain terminal of said transistor;

e. second electrically conductive means coupled to said source to form the source terminal of said transistor;

f. third electrically conductive means coupled to the portion of said region having said second conductivity type to provide a terminal coupled to said channel through a low resistance path.

5. A transistor in accordance with claim 1 further including an insulating substrate on which said semiconductor structure is formed.

6. A transistor in accordance with claim 5 wherein said insulating substrate is sapphire.

7. A transistor in accordance with claim 1 wherein said first conductivity type is P.

8. A transistor in accordance with claim 1 wherein said first conductivity type is N.

9. A transistor in accordance with claim 3 further including a plurality of said regions of a second conductivity type.

10. A transistor in accordance with claim 9 wherein said plurality of regions of a second conductivity type are interdigitated with regions of said first conductivity type, said regions of said first conductivity type forming the source of said transistor.

* * * * *

REEXAMINATION CERTIFICATE (57th)

United States Patent [19]
Cricchi et al.

[11] B1 4,053,916
[45] Certificate Issued    Mar. 8, 1983

[54] SILICON ON SAPPHIRE MOS TRANSISTOR

[75] Inventors: James R. Cricchi, Catonsville, Michael D. Fitzpatrick, Glen Burnie, both of Md.

[73] Assignee: Westinghouse Electric Corporation, Pittsburgh, Pa.

Reexamination Request
No. 90/000,159, Feb. 16, 1982

Reexamination Certificate for:
Patent No.: 4,053,916
Issued: Oct. 11, 1977
Appl. No.: 610,493
Filed: Sep. 4, 1975

[51] Int. Cl.³ ............... H01L 27/12, H01L 29/34, H01L 291
[52] U.S. Cl. ........... 357/23, 357/4, 357/15, 357/52, 357/55, 357/86
[58] Field of Search ..... 357/4, 23, 15, 357/52, 55, 86

[56] References Cited

U.S. PATENT DOCUMENTS 3,305,708  2/1967  Ditrick.
3,590,342  6/1971  Jekat.
3,868,187  2/1975  Masuoka.
3,958,266  5/1976  Athanas.
4,053,916  10/1977 Cricchi et al.

OTHER PUBLICATIONS

RCA COS/MOS Integrated Circuits Manual, pp. 24–25, printed 3/71.

RCA Solid-State Devices Manual, pp. 230-233, printed 3-75.

*Primary Examiner*—Edward J. Wojciechowicz
*Attorney, Agent, or Firm*—W. E. Zitelli

[57] ABSTRACT

An MOS transistor constructed using silicon on sapphire technology in which the channel region can be electrically connected either to the source or drain terminal is disclosed. The transistor is advantageous in that the shift of the threshold voltage of the transistor in the presence of radiation is substantially decreased. Connecting the channel region of the transistor to the source terminal also substantially reduces what is normally referred to as the "kink" effect in MOS transistors utilizing floating substrate channel regions. Reducing the sensitivity to radiation and the kink effect results in a transistor having improved electrical characteristics.

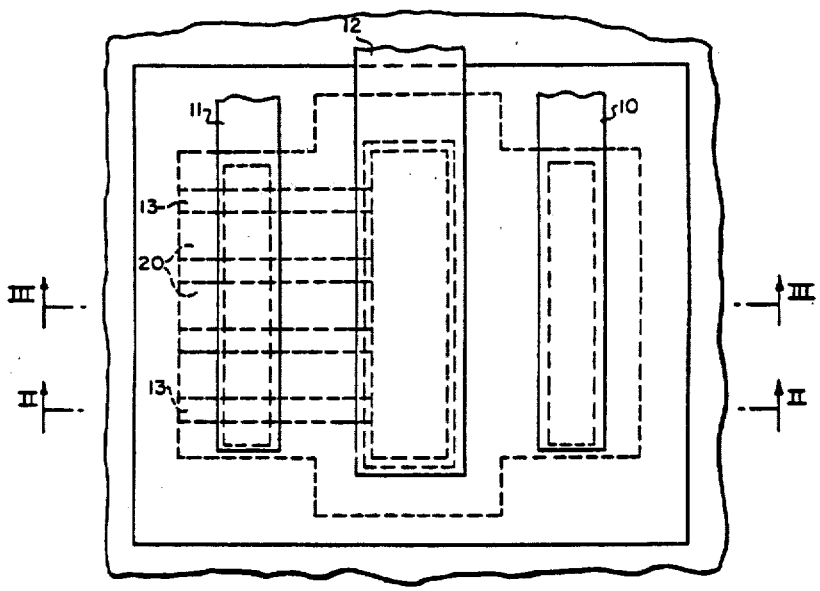

REEXAMINATION CERTIFICATE ISSUED UNDER 35 U.S.C. 307.

THE PATENT IS HEREBY AMENDED AS INDICATED BELOW.

Matter enclosed in heavy brackets appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 4 is confirmed.

Claims 1-3 are determined to be patentable as amended:

1. A planar transistor comprising
   a. a semiconductive structure including:
      1. a channel region of a first conductivity type interposed between drain and source regions of a second conductivity type,
      2. at least one high conductivity region of said first conductivity type contiguous to said source and channel regions;
   b. an insulating layer overlying said channel region;
   c. an electrically conductive layer overlying said insulating layer to form the gate of said transistor;
   d. electrically conductive means electrically coupled to said drain region to form the drain terminal of said transistor; and
   e. electrically conductive means [coupled to] *in direct contact with both* said source region and [to] said high conductivity region to form the source terminal of said transistor.

2. A planar MOS transistor having gate, source and drain terminals comprising:
   a. a semiconductive structure including:
      1. drain and source regions of a first conductivity type,
      2. a channel region of second conductivity type interposed between said drain and source regions,
      3. at least one electrically conductive region of said second conductivity type forming a low resistance path to said channel region;
   b. an electrically insulating layer overlying said channel region;
   c. an electrically conductive layer overlying said insulating layer to form the gate of said transistor;
   d. second electrically conductive means coupled through a low resistance path to said drain region to form the drain terminal [by] *of* said transistor; and
   e. third electrically conductive means [coupled through a low resistance path to] *in direct contact with both* said source region and [to] said at least one electrically conductive region of said second conductivity type to form the source *terminal* of said transistor.

3. A planar MOS transistor having a gate, source and drain terminals comprising in combination;
   a. a semiconductive structure supported on an electrically insulating substrate, said semiconductive structure comprising;
      1. drain and source regions of a first conductivity type,
      2. a channel region of a second conductivity type interposed between said drain and source region,
      3. at least one electrically conductivity region of said second conductivity type forming a low resistance path to said channel region;
   b. an electrically insulating layer overlying said channel region;
   c. first electrically conductive means overlying said insulating layer to form said gate terminal;
   d. second electrically conductive means coupled through a low resistance path to said drain region to form the drain terminal [by] *of* said transistor; and
   e. third electrically conductive means [coupled through a low resistance path to] *in direct contact with both* said source region and [to] said at least one electrically conductive region of said second conductivity type to form the source *terminal* of said transistor.

Claims 5-10, dependent on amended claims, are determined to be patentable.

* * * * *